United States Patent
Loucks

(10) Patent No.: US 7,034,554 B2
(45) Date of Patent: Apr. 25, 2006

(54) METHOD AND APPARATUS FOR MEASURING IMPEDANCE ACROSS PRESSURE JOINTS IN A POWER DISTRIBUTION SYSTEM

(75) Inventor: David G. Loucks, Coraopolis, PA (US)

(73) Assignee: Eaton Corporation, Cleveland, OH (US)

( * ) Notice: Subject to any disclaimer, the term of this patent is extended or adjusted under 35 U.S.C. 154(b) by 24 days.

(21) Appl. No.: 10/643,351

(22) Filed: Aug. 19, 2003

(65) Prior Publication Data

US 2005/0040835 A1   Feb. 24, 2005

(51) Int. Cl.
*G01R 27/08* (2006.01)
(52) U.S. Cl. ........................ 324/713; 324/525
(58) Field of Classification Search ............... 324/714, 324/715, 525, 509, 691, 537–538, 713
See application file for complete search history.

(56) References Cited

U.S. PATENT DOCUMENTS

| | | | |
|---|---|---|---|
| 4,047,104 A | 9/1977 | Sparber | |
| 4,398,145 A | 8/1983 | Quayle | |
| 4,947,469 A * | 8/1990 | Vokey et al. | 324/523 |
| 4,954,782 A * | 9/1990 | Ball | 324/538 |
| 4,963,830 A | 10/1990 | Roth et al. | |
| 5,006,809 A | 4/1991 | Mang et al. | |
| 5,189,375 A * | 2/1993 | Tuttle | 324/537 |
| 5,365,180 A | 11/1994 | Edelman | |
| 5,371,469 A | 12/1994 | Anderson | |
| 5,391,991 A * | 2/1995 | Tuttle | 324/529 |
| 5,600,255 A | 2/1997 | Moore et al. | |
| 5,764,462 A * | 6/1998 | Tanaka et al. | 361/42 |
| 6,160,402 A | 12/2000 | Naglich et al. | |
| 6,225,810 B1 * | 5/2001 | Godo et al. | 324/525 |
| 6,281,685 B1 * | 8/2001 | Tuttle | 324/529 |
| 6,448,780 B1 * | 9/2002 | Jurisch | 324/525 |
| 6,477,021 B1 * | 11/2002 | Haun et al. | 361/42 |

* cited by examiner

*Primary Examiner*—Anjan Deb
*Assistant Examiner*—M. Kramskaya
(74) *Attorney, Agent, or Firm*—Martin J. Moran

(57) ABSTRACT

The difference in voltages measured upstream and downstream of a pressure junction in a power distribution system produced by the energizing power is divided by the measured current to calculate a value that is a function of the impedance of the pressure junction, which is monitored for deterioration. To eliminate noise resulting from dividing a small number by a large number and transients in the power distribution system, the impedance is calculated from the squares of the voltage differences and currents for a large number of samples, and the change between successive calculations is limited to produce a stable median value.

2 Claims, 5 Drawing Sheets

METHOD AND APPARATUS FOR MEASURING IMPEDANCE ACROSS PRESSURE JOINTS IN A POWER DISTRIBUTION SYSTEM

BACKGROUND OF THE INVENTION

1. Field of the Invention

This invention relates to detecting loose and otherwise faulty pressure joints in power distribution systems, and particularly, by monitoring the impedance across the pressure joints using the power delivered to a load.

2. Background Information

Power systems distributing electrical power throughout an installation, such as for instance a building, typically include different types of conductors and devices, such as switches, circuit breakers, contractors, overload relays, network protectors, and the like that are mechanically interconnected. The conductors can be rigid bus bars and bus ways made up of sections bolted together, including branch connections. Other conductors include cables bolted or clamped to the bus bars or bus ways and to the various devices mentioned above.

One mode of failure in these systems occurs when the pressure junctions increase in resistance. Loose fittings, dirt, corrosion or moisture are all common causes of this increase in resistance. The resultant heat generated by such failures reduces the efficiency of the power distribution system and can lead to interruption of power. The state of the art method of detecting this problem is infrared scanning. However, this technique usually requires partial disassembly of the equipment to gain access to hidden connections and is not suitable for continuous monitoring. It has been suggested in U.S. Pat. No. 5,600,255 that loose connections in live ac power systems can be detected by injecting a known dc current into the ac power bus and measuring the dc voltage drop across the pressure junction. This technique requires a constant dc current source and filters to isolate the dc voltage reading from the ac voltage on the live bus.

An improved method and apparatus is needed for determining the resistance across joints in a power distribution system.

SUMMARY OF THE INVENTION

In accordance with the invention, the load current flowing through an energized power distribution system is used to monitor the impedance across pressure junctions in a section of the system. By energized power distribution system it is meant a system delivering power. Thus, the invention does not require the injection of a dedicated monitoring current. Voltage measurements are taken at the two ends of the section as well as a measurement of the current flowing through the pressure junction. The impedance of the pressure junction is a function of the difference between the two voltage readings (and hence the voltage drop across the junction) divided by a function of the current. In the preferred embodiment of the invention, the voltage and current measurements are taken repetitively, multiple times per cycle of the power when applied to an ac power distribution system. The voltage differences are squared and summed for a selected number of measurements. Likewise, the current measurements are squared and summed for the same number of measurements and divided into the summed voltage differences squared to generate the representation of the impedance across the pressure junction.

In order to filter out switching and other transients, the change in the reported impedance between successive calculations is limited. This can be accomplished by only allowing the value of the impedance to change by a selected step size between successive calculations. In the exemplary system, the step change is equal to a selected gain times an initial calculated value of the impedance. Synchronization of the two voltage measurements can be utilized to further reduce the effects of transients.

The voltage and current measuring capabilities of devices such as: switches, circuit breakers, contractors, network protectors, overcurrent relays, monitors, analyzers and the like existing in a distribution system, supplemented as needed by additional measuring devices, can be utilized to implement the invention.

The effects of power factor can be eliminated by starting the summing of the voltage differences at a zero crossing of the difference and starting the accumulation of current measurements at the zero crossing of the current closest to the zero crossing of the voltage difference.

The invention embraces both a method and apparatus for determining the impedance across pressure junctions in ac and dc power distribution systems using the ac or dc power delivered by the system.

In particular, the invention is directed to a method of determining the impedance across a pressure junction in a section of an energized power distribution system using power delivered by the system comprising: measuring a first voltage produced by the power at a first end of the section of the power distribution system, measuring a second voltage produced by the power at a second end of the section of the power distribution system, measuring current through the pressure junction, and determining the impedance as a difference between the first voltage and the second voltage divided by the current.

The invention is also directed to apparatus for determining the impedance across a pressure junction in a section of an energized power distribution system using the energizing power, comprising: first voltage measuring means measuring a first voltage produced by the power at a first end of the section of the energized power distribution system, second voltage measuring means measuring a second voltage produced by the energizing power at a second end of the section of the energized power distribution system, current measuring means measuring current through the section of the energized power distribution system, and means determining impedance by dividing a difference between the first voltage and the second voltage by the current.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
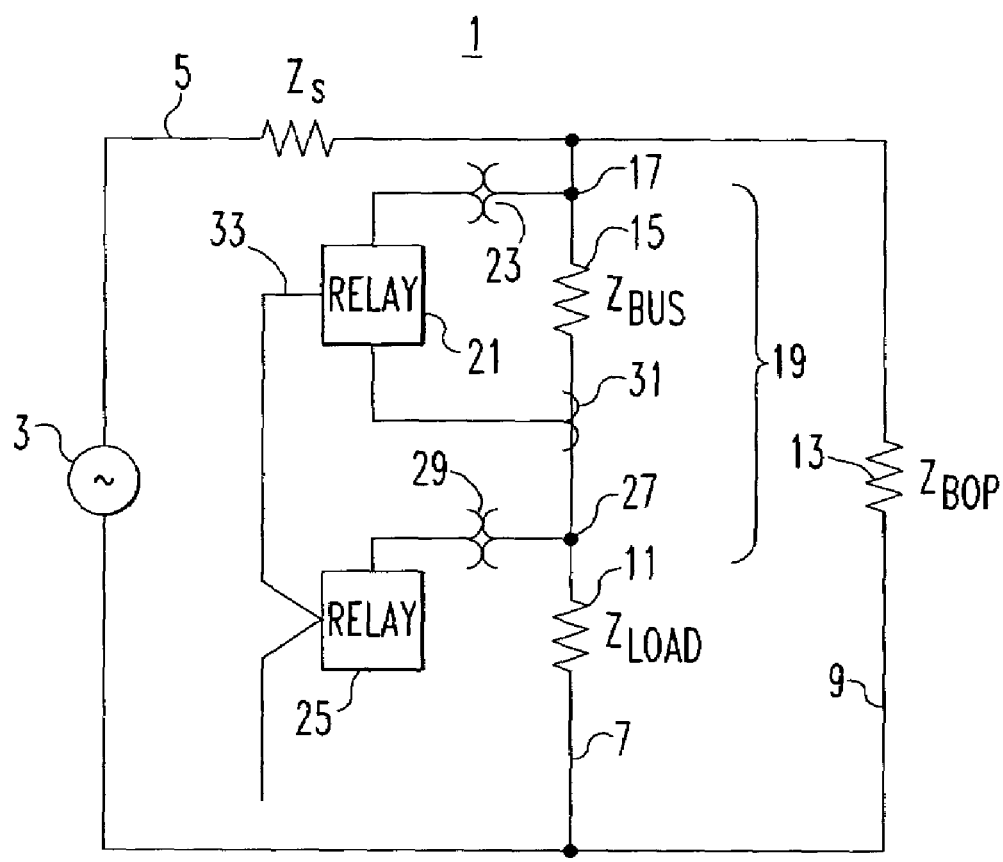
FIG. 1 is a schematic circuit diagram of an idealized electric power system incorporating the invention.

FIG. 1 is a schematic circuit diagram of an idealized ac electric power distribution system 1 to which the invention has been applied. As mentioned, the invention can also be applied to dc electric power distribution systems. The power distribution system 1 includes a power source 3 providing power through a main bus 5 to feeder buses 7 and 9. The feeder bus 7 provides the power to a load 11 while the feeder 9 provides power to other loads 13 collectively referred to as balance of plant (BOP). The power distribution system 1 upstream of the feeder buses 7 and 9 has a source impedance $Z_s$, which is typically inductive but also has a resistive component. Impedances $Z_{load}$ and $Z_{BOP}$ of the load 11 and balance of plant 13 can be inductive, capacitive or resistive. The feeder 7 has a pressure junction 15 formed by a mechanical connection such as a bolted connection between bus bars or bus ways or cable terminal connections or the like, that has an impedance $Z_{bus}$. Typically, this impedance $Z_{bus}$ will be primarily resistive.

A good pressure junction 15 will have a low impedance; however, a faulty junction could have a substantial resistance that could result in heating and more serious consequences. Such faulty pressure junctions can be the result of a loose fitting, dirt, corrosion, moisture, vibration or thermal cycling that results in an increase in electrical resistance across the junction. The resistance across a pressure junction 15 can be quite low, even in the case of a faulty junction. However, even a small increase in resistance of the pressure junction can result in the generation of the considerable amount of heat in the case of a feeder bus carrying heavy load current. The problem presented is determining changes in the impedance across the pressure junction even in the presence of voltage harmonics, switching transients, and load changes. Typically, the change in impedance due to a faulty pressure junction will occur slowly over time, although the change could occur more rapidly as in the case of a loose connection.

In accordance with the invention, the impedance in the feeder bus 7 containing the pressure junction 15 is determined by dividing the difference between the upstream and downstream voltage in the bus by the current through the bus according to the following equation.

$$Z_{bus} = \frac{V_{upstream} - V_{downstream}}{I_{bus}} = \frac{V_{diff}}{I_{bus}} \quad \text{Eq. 1}$$

There are several challenges raised by this technique. Resolution is an issue as the voltage drop across the bus is very small and therefore a small number is being divided by a large number. Other challenges are: changing power factor, sampling rate jitter, and synchronization of the snapshots of the upstream and downstream voltages. All of these issues are addressed by the invention as will be discussed.

The upstream voltage is recorded as a first voltage measured at a first end 17 of a section 19 of the bus 7 containing the pressure junction 15. In the exemplary system, this first voltage is measured by a first relay 21 through a voltage transformer 23. A second relay 25 measures the downstream voltage as a second voltage at a second end 27 of the section 19 through a second voltage transformer 29. While separate relays 21 and 25 are shown in the exemplary implementation of the invention, a single relay or other device could make both voltage measurements. The ac current, $I_{bus}$, flowing through the section 19 of the bus 7 is measured by the relay 21 through the current transformer 31. Either relay 21 or 25 can make the current measurement or the current measurement could be made by a combined unit or even a separate current relay. Even if the section 19 of the bus is lengthy, the impedance of the pressure junction 15 will dominate, and in any event, it is a change in impedance over time that signals a deteriorating pressure junction as the impedance of the conductors themselves will not noticeably change.

The sampling of the voltages and current may be synchronized through synchronizing link 33 between the relays 21 and 25 where separate relays are utilized. Known techniques for synchronization can be implemented. For instance, one of the relays 21 and 25 can be designated a master that transmits a synchronizing signal over the synchronization link 33 to the other relay, which is the slave. This synchronization permits both relays 21 and 25 to capture the same waveforms.

In accordance with the invention, the ac voltages and current in the section 19 are repetitively sampled multiple times during each cycle of the ac power being supplied to the load 11. Higher sampling rates permit the capture of higher harmonics.

Figure 2:
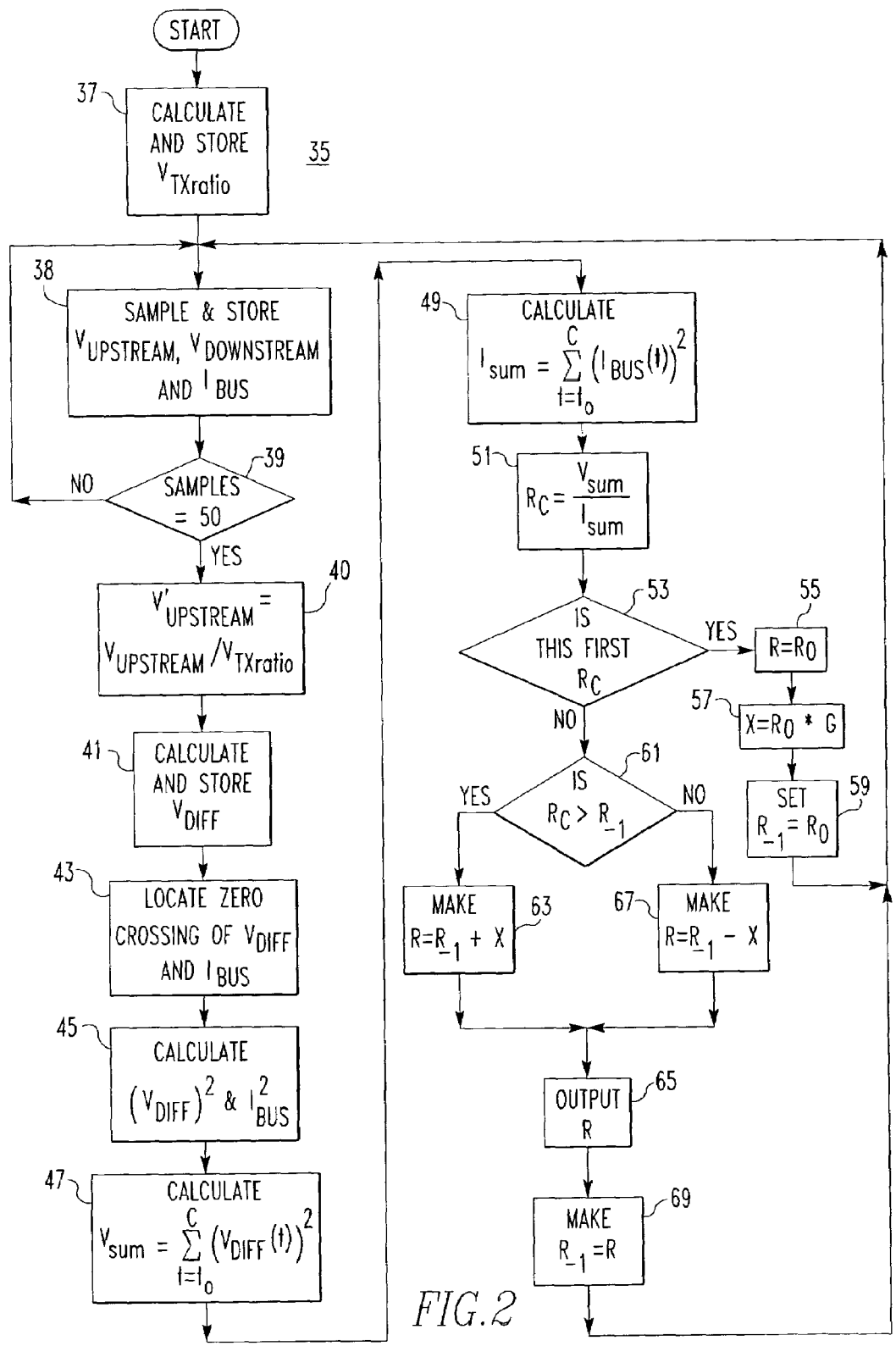
FIG. 2 is a flow chart of software implementing the invention.

In the exemplary embodiment of the invention the relays 21 and 25 are digital. FIG. 2 illustrates a flow chart used by the system to determine the impedance in the bus section 19, and therefore, any change in the impedance of the pressure junction 15. Upon startup, the effect of any transformer that might be present in the distribution system between the points at which the first and second voltages are measured is taken into account. Such a transformer would produce a difference in the upstream and downstream voltages determined by the transformer ratio. This transformer ratio could be applied to the voltage samples if known. Better yet, the exemplary system can determine and apply the transformer ratio. Typically the transformer in a distribution system will be a step down transformer, in which case, the upstream voltage will be larger than the downstream voltage if a transformer is present. In any event, the transformer ratio, $V_{TXRATIO}$, is calculated, by dividing the upstream voltage by the downstream voltage, and stored at 37. If no transformer is present, the ratio will be essentially one. A loop is then entered in which $V_{upstream}$, $V_{downstream}$ and $I_{bus}$ are periodically sampled and stored at 38. In the exemplary system, each of these parameters is measured 28 times per half cycle of the ac power. A selected number of samples, in the example 50, are gathered as indicated at 39. The upstream voltage readings are then adjusted for the transformer ratio at 49. This results in normalization of the impedance readings to the impedance at start up, whether or not there is a transformer present. Next, $V_{diff}$, which is the difference between the upstream and the downstream voltage, is calculated and stored at 41. Following this, the zero crossings of $V_{diff}$ and of $I_{bus}$ are located at 43. The $V_{diff}$ zero crossing is located by a change of polarity. The $I_{bus}$ zero crossing is identified as the sample of current closest to the samples making up the zero crossing of the diff at which the current changes polarity. The voltage difference and the current are then squared at 45. The voltage differences squared for the 50 samples are then summed at 47 to generate $V_{sum}$. Similarly, the current squared values for the 50 samples are summed at 49 to generate $I_{sum}$. The 50 samples of the voltage difference and current are counted from the corresponding zero crossings to eliminate the effect of power factor. The impedance of the section of the feeder bus, and therefore, essentially across pressure junction 15, is calculated at 51 by dividing $V_{sum}$ by $I_{sum}$ to generate the calculated impedance $R_c$.

Figure 3:
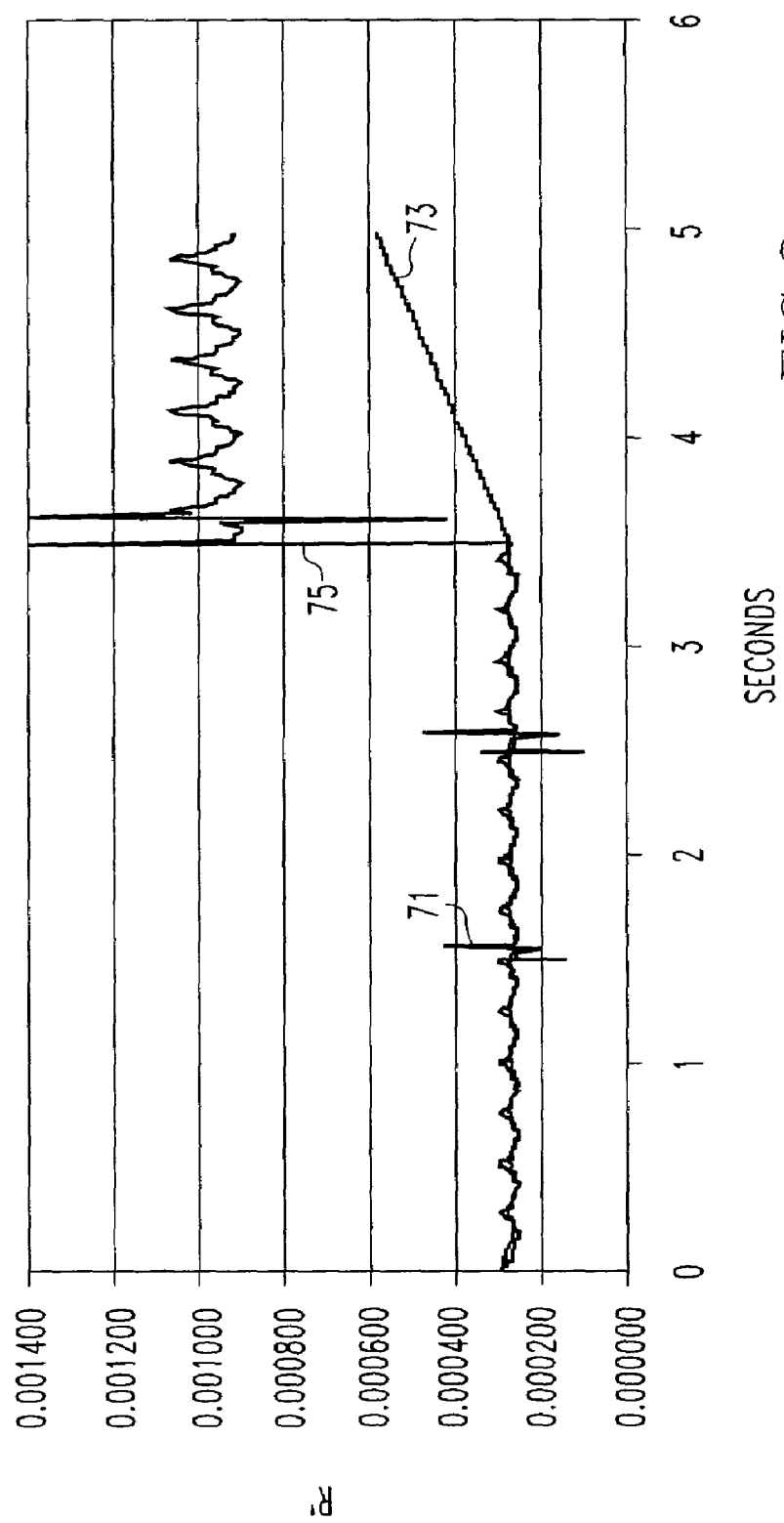
FIG. 3 is a graph illustrating the response of the invention to transients in ac voltage and to a step change in impedance.
Figure 4:
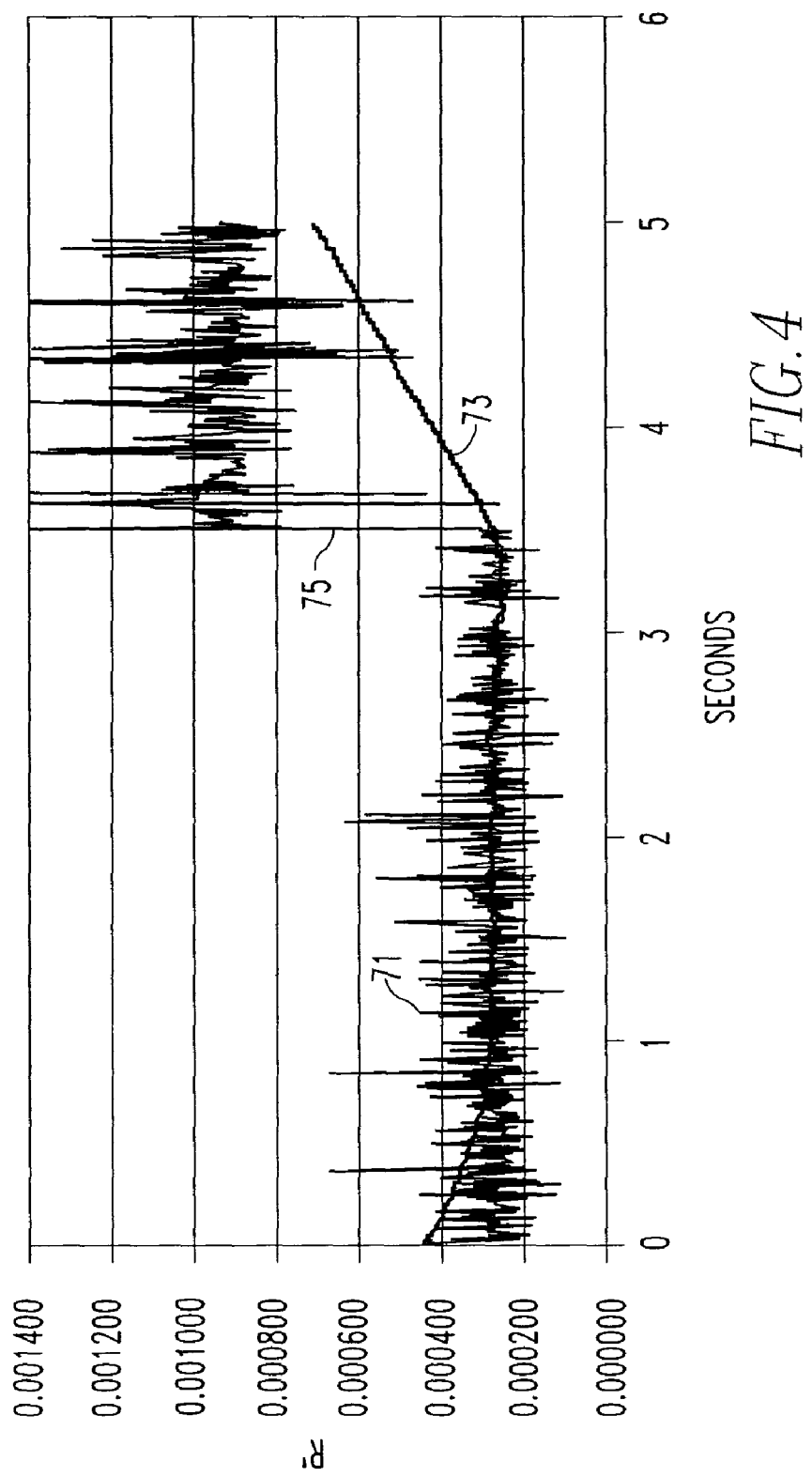
FIG. 4 is a graph illustrating the effects of jitter on the response of the invention.

As discussed, the impedance calculated, $R_c$, can be quite noisy, primarily because a small number is being divided by a large number, but also because of jitter caused by slight variations in the timing of the measurements. In addition, large disturbances are introduced by switching, either in the feeder branch 7 or the balance of plant feeder 9, and by other transients. In order to reduce these effects, the amount by which successive calculations of the impedance can be changed is limited. In the exemplary embodiment of the invention, changes in successive values of the impedance output, R, are limited to steps equal to the initial calculated value of the impedance, $R_0$, multiplied by a gain, G. Thus, in the flow chart 35, the first time that the impedance $R_c$ is calculated as determined at 53 the impedance R output is made equal to the $R_0$ at 55. The step X by which the impedance R will be permitted to change is then calculated at 57 as the $R_0$ multiplied by the gain G. Next, the parameter $R_{-1}$, which represents the last output value for the impedance is made equal to $R_0$ at 59. The next set of samples are then generated by returning to the sampling loop at 37. As the next time that the impedance is calculated at 51 will not be the first time as determined at 53, a determination is made whether the new calculated value of impedance, $R_c$, is greater or smaller than the last output value, $R_{-1}$, as determined at 61. If the new calculated value is greater than the last output value, the impedance output, R, is set by adding the step X to the last value of impedance, $R_{-1}$, at 63 and this new value is output as the impedance R at 65. If the latest calculated value of impedance is less than the previous value, then a negative step, −X, is added to the previous value at 67 and output as the impedance R at 65. In either case, this newly output value of impedance is recorded as the last value at 69 for the next set of samples A computer simulation of the invention was implemented to assess its effectiveness. The results are illustrated in FIGS. 3 and 4. In FIG. 3, the trace 71 illustrates the instantaneous value of the calculated impedance. This is the value $R_c$ calculated at 51 in FIG. 2. As can be seen from FIG. 3, this instantaneous value has considerable noise due to harmonics. The effects of load switching at 1.5 seconds and 2.5 seconds can also be seen. The trace 73 represents the median value produced by the smoothing algorithm and which is output as the impedance R at 65 in FIG. 2. Different levels of smoothing can be produced by adjusting the gain G used at 57 in FIG. 2.

FIG. 3 also illustrates at 75 an increase in bus impedance to twice the previous value at 3.5 seconds. This increase appears to be four times the previous value in FIG. 3 due to the built-in gain in the algorithm (provided by the squaring of sampled values). As the smoothing algorithm gain, G, in the example was set to a low value to provide a high level of smoothing, it can be seen that the median value 73 slowly changes to the final value. In the example, this is reached at approximately nine seconds, or 5.5 seconds after the step change in impedance.

As mentioned above, lack of synchronization of the samples results in jitter. FIG. 4 illustrates the simulation of this lack of synchronization of the voltage and current in 13 samples out of 28 in the summed group or a jitter of 49.2 percent. The same switching events as in FIG. 3 occur at 1.5 seconds and 2.5 seconds, but are overwhelmed in the FIG. 4 example by the jitter. However, the median value of impedance output 73 filters out all of this noise while still detecting the step change in impedance at 3.5 seconds.

Figure 5:
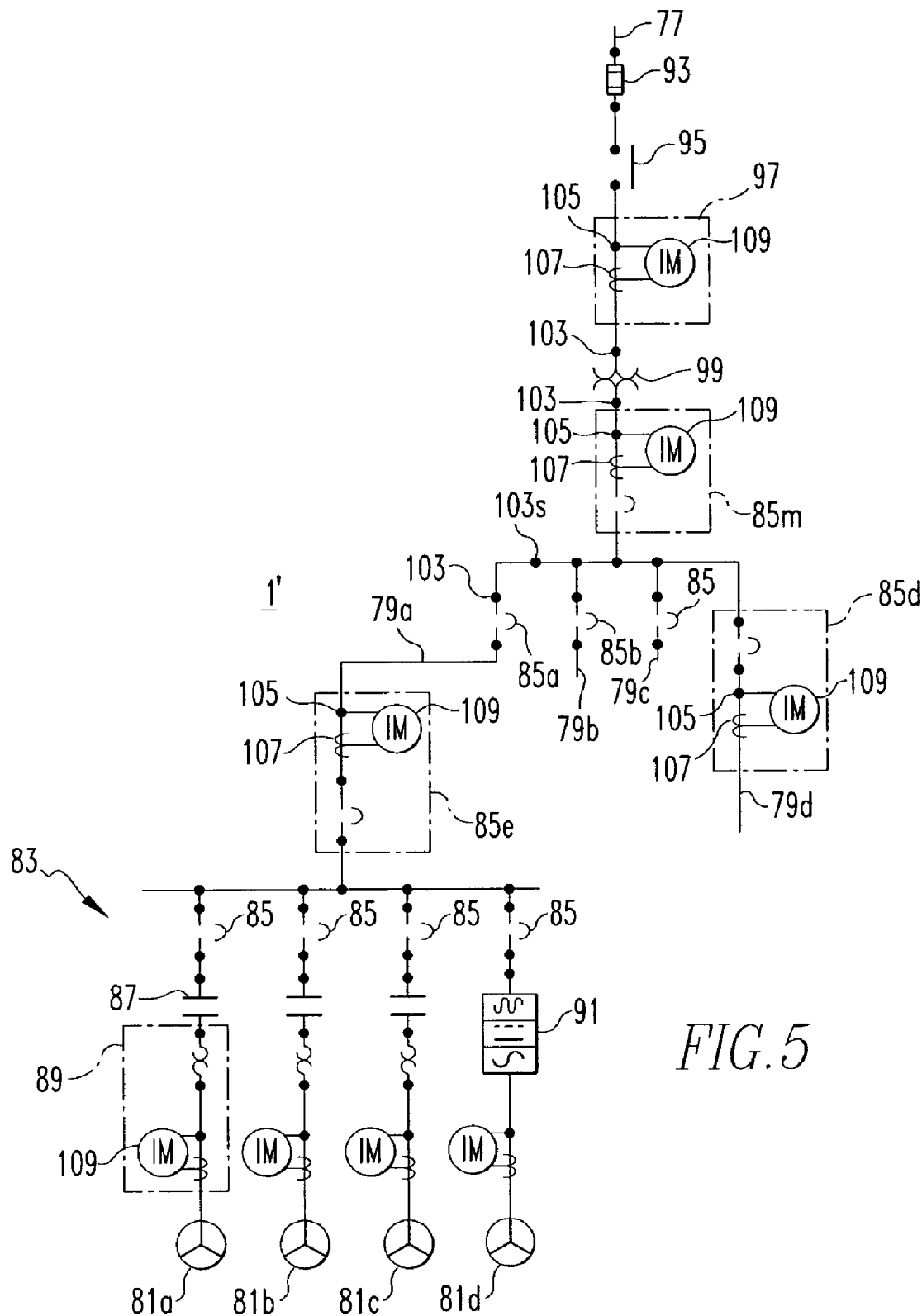
FIG. 5 is a schematic circuit diagram of an exemplary application of the invention.

FIG. 5 illustrates application of the invention to a practical ac power distribution system 1'. This system includes a main bus 77 connected to a source (not shown) providing ac power to a number of feeder buses 79a–79d. The feeder bus 79a in turn energizes a number of loads such as motors 81a–81d. The motors 81a–81c are each controlled by a motor starter 83 that energizes the motor from the feeder bus 79a. Each motor starter includes a circuit breaker 85, a contractor 87 and an overload relay 89, as is well known. The fourth motor, 81d, is energized by a variable speed drive 91 through another circuit breaker 85. Each of the feeder buses 79a through 79d has a circuit breaker 85a through 85d, respectively, adjacent its connection to the main bus 77. The main bus 77 has a fuse 93, a main disconnect switch 95, a meter 97, stepdown transformer 99 and a main circuit breaker 85m. An additional circuit breaker 85e is included in the feeder bus 79a adjacent the motor starters 83. The power distribution system 1' has a number of pressure junctions 103 represented by the solid dots. These pressure junctions 103 include terminals on the various devices, such as for example, the circuit breakers 85, as well as bolted connections 103s at shipping splits in the buses such as bus 79a. The meter 97 already includes a voltage tap 105 and a current transformer 107 for performing the metering functions. These voltage and current measurements can be used to perform the impedance monitoring function 109. The circuit breakers 85e, 85d and 85m include a current transformer 107 for performing the protection function. They also have a voltage tap 105 or the voltage tap can be added to implement the metering function 109.

As can be seen from FIG. 5, the meter 97 and main breaker 85m are on the ends of a section of the main bus 77 that includes the step-down transformer 99, which has two pressure connections 103 to the meter 97 and the main circuit breaker 101. Thus, the meter 97 can measure the upstream voltage while the main breaker 85m measures the downstream voltage. The current reading from either the meter or main breaker can be used for the current measurement. It will be noticed that the impedance will be that of the two pressure junctions plus the impedance of the transformer. The effect of the transformer can be eliminated by converting the voltage reading taken on the side of the transformer opposite that at which the current reading is taken using the transformer ratio. While this particular arrangement does not identify the particular faulty junction, it narrows the investigation to these two junctions which can then be examined. The technique of starting the voltage and current sampling at the zero crossings eliminates the inductive impedance introduced by the transformer.

Other pressure junctions 103 in the power distribution system 1' can be monitored by other combinations of readings taken with the impedance monitoring function 109 built into the other components. For instance, readings taken by the main breaker 101 and the breaker 85d monitor pressure connections between these two circuit breakers. Similarly, the breaker 85e can cooperate with the main breaker 101 to monitor the group of pressure junctions between them, including the connections to the feeder breaker 85a. Again, a more detailed investigation would have to be conducted to identify the particular pressure junction between these two breakers. It can also be seen that by incorporating the impedance monitoring function 109 into the overload relays 89, that the pressure junctions between the components of the motor starters 83 can be monitored by using the impedance monitoring function built into the circuit breaker 85e.

It can be appreciated, therefore, that the invention permits the impedance of pressure junctions in an ac power distribution system to be monitored on line using the ac power delivered by the power system. No constant dc current source or the filters needed in dc monitoring systems to block the ac power are required. The invention can be applied to an existing system utilizing, in many cases, existing voltage and current measuring components.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A method of determining the impedance across a pressure junction in a section of an energized power distribution system using the energizing power, the method comprising:

measuring a first voltage produced by the energizing power at a first end of the section of the energized power system;

measuring a second voltage produced by the energizing power at a second end of the section of the energized power system;

measuring current through the section of the energized power system produced by the energizing power;

determining the impedance as a difference between first voltage and the second voltage divided by the current;

wherein the measuring of the first voltage, the second voltage and the current is performed repeatedly multiple times, and wherein determining the impedance of the section of the power distribution system comprises summing a difference between the first and second voltages to generate a summed voltage difference and summing the current to generate a summed current for a selected number of measurements of the first voltage, the second voltage and the current, and dividing the summed voltage difference by the summed current to generate the impedance;

wherein determining impedance comprises summing a squared difference between the first voltage and the second voltage to generate a summed voltage difference squared and summing the current squared to generate a summed current squared for the selected number of measurements of the first voltage, the second voltage and the current and dividing the summed voltage difference squared by the summed current squared to generate a representation of the impedance; and wherein the energized power distribution system is an ac power distribution system in which the first voltage, the second voltage and the current are all ac and wherein determining the impedance comprises selecting measurements of the first ac voltage, the second ac voltage and measurements of the ac current used in generating the summed voltage difference squared and the summed current squared to eliminate any power factor in the energizing ac power.

2. The method of claim 1 wherein the selected number of the first ac voltage and the second ac voltage measurements used to generate the summed voltage difference squared and the selected number of ac current measurements used to generate the summed current squared are selected to begin at a zero crossing of the difference between the first and second ac voltage, and a closest zero crossing of the ac current.

* * * * *